United States Patent
Huang et al.

(10) Patent No.: US 8,360,828 B2
(45) Date of Patent: Jan. 29, 2013

(54) CUTTING TOOL

(75) Inventors: Jan-Chen Huang, Kaohsiung (TW); Chu-Ching Sung, Kaohsiung County (TW); Ming-Yu Huang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 341 days.

(21) Appl. No.: 12/875,764

(22) Filed: Sep. 3, 2010

(65) Prior Publication Data
US 2011/0259166 A1 Oct. 27, 2011

(30) Foreign Application Priority Data

Apr. 27, 2010 (TW) ................................. 99113295 A

(51) Int. Cl.
*B24B 7/00* (2006.01)
(52) U.S. Cl. ........ 451/178; 451/231; 451/541; 451/544; 125/13.01; 125/18; 83/520
(58) Field of Classification Search .................... 451/41, 451/54, 178, 182, 231, 541, 544, 546; 83/520; 125/13.01, 18
See application file for complete search history.

(56) References Cited

U.S. PATENT DOCUMENTS

| | | | | |
|---|---|---|---|---|
| 5,954,844 | A * | 9/1999 | Law et al. | 51/306 |
| 6,319,754 | B1* | 11/2001 | Wang et al. | 438/113 |
| 7,901,973 | B2* | 3/2011 | Yamamoto | 438/65 |
| 2009/0017323 | A1* | 1/2009 | Webb et al. | 428/521 |
| 2009/0273047 | A1* | 11/2009 | Yamamoto | 257/432 |
| 2011/0014732 | A1* | 1/2011 | Lee | 438/27 |

OTHER PUBLICATIONS

Hwai-Fu Tu, "Characterizations of Electrochemically Synthesized Zinc Oxide" PHD Thesis, Jun. 2008, Department of Electrical engineering National Sun Yat-Sen University, Kaohsiung, Taiwan.

* cited by examiner

*Primary Examiner* — Eileen P. Morgan
(74) *Attorney, Agent, or Firm* — J.C. Patents

(57) ABSTRACT

A cutting tool suitable for cutting a workpiece placed on a photocurable adhesive layer is provided. The cutting tool includes a main body, a cutting layer and a light emitting material. The cutting layer is disposed on a surface of the main body and is applicable in cutting the workpiece. The light emitting material is disposed inside the cutting layer or between the main body and the cutting layer. The light emitting material is suitable for emitting a light capable of curing the photocurable adhesive layer adjacent to a cutting path as the workpiece is cut by the cutting layer.

8 Claims, 5 Drawing Sheets

CUTTING TOOL

CROSS-REFERENCE TO RELATED APPLICATION

This application claims the priority benefit of Taiwan application serial no. 99113295, filed on Apr. 27, 2010. The entirety of the above-mentioned patent application is hereby incorporated by reference herein and made a part of this specification.

BACKGROUND

1. Field of the Invention

The present invention relates to a cutting tool, and more particularly to a cutting tool for cutting a work piece place on a light curing glue layer.

2. Description of Related Art

In the conventional die mounting process, epoxy resin adhesive is used for anchoring a post-sawed die on a package substrate. However, as thicknesses of a die and a package substrate continue to slim down, the epoxy resin adhesive is replaced by the adhesive film. The thin film type of adhesive can be uniformly thin; hence, the problems in the conventional die mounting process, such as dripping and die tilt, could be improved.

Generally speaking, an adhesive layer having a same size and shape as those of the wafer could be attached to the backside of the wafer. After polishing the wafer to a predetermined thickness, the adhesive layer and the wafer are diced together.

As the adhesive layer and the wafer are being currently diced, scraps generated from the adhesive layer could attach to and contaminate the cutting tool, and scissel chips could stick to the surface of the adhesive layer. Ultimately, the subsequent die bonding is deficient.

SUMMARY OF THE INVENTION

The present invention is directed to a cutting tool, wherein the probability of contaminating the surface of the cutting tool by an adhesive substance to thereby compromise the cutting ability of the cutting tool is reduced.

The present invention provides a cutting tool, suitable to cut a workpiece disposed on a photocurable adhesive layer. The cutting tool includes a main body, a cutting layer and a light emitting material. The cutting layer is disposed on the surface of the main body for cutting the workpiece. The light emitting material, disposed inside the cutting layer or between the cutting layer and the main body, is used to release a light when the cutting layer cuts the workpiece, such that the photocurable layer adjacent to the cutting path is cured.

According to an exemplary embodiment of the invention, the light emitting material emits an ultraviolet light.

According to an exemplary embodiment of the invention, the light emitting material comprises zinc oxide nano-coating layer.

According to an exemplary embodiment of the invention, the cutting layer includes diamond particles.

According to an exemplary embodiment of the invention, the above main body has a disk shape, and the light emitting material and the cutting layer are disposed on the circumference of the disk-shaped main body.

According to an exemplary embodiment of the invention, the light emitting material is dispersed in the cutting layer.

Accordingly, the cutting tool of an exemplary embodiment of the invention is disposed with a light emitting material. When the cutting layer of the cutting tool performs a cutting on the workpiece disposed on the photocurable adhesive layer, the photocurable adhesive layer, adjacent to the cutting path P, would be cured by the light emitted from the light emitting material. Hence, the chances of having the adhesive substance of the photocurable adhesive layer to attach to and contaminate the cutting tool during the cutting process could be lowered to better maintain the cutting ability of the cutting tool.

In order to the make the aforementioned and other objects, features and advantages of the present invention comprehensible, a preferred embodiment accompanied with figures are described in detail below.

DESCRIPTION OF EMBODIMENTS

Figure 1:
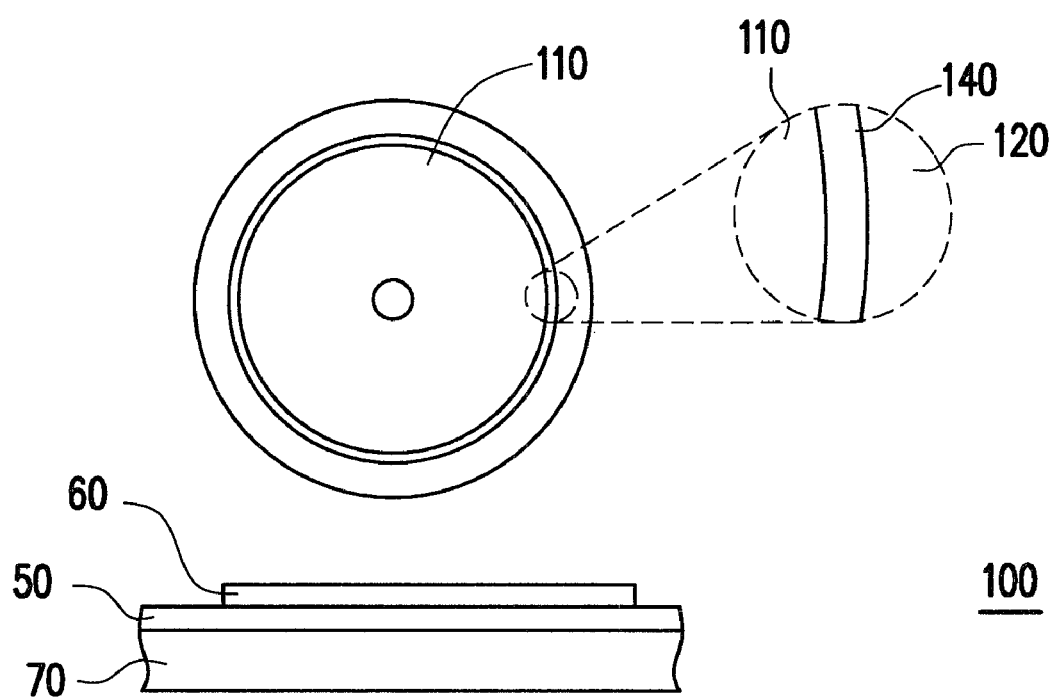
FIG. 1 is a schematic diagram of a cutting tool according to an exemplary embodiment of the disclosure.

FIG. 1 is a schematic diagram of a cutting tool according to an exemplary embodiment of the disclosure. Referring to FIG. 1, the cutting tool 100 in this exemplary embodiment includes a main body 110, a cutting layer 120 and a light emitting material 140. The cutting layer 120 is disposed on the surface of the main body 110 for cutting the work piece 60 placed on the photocurable adhesive layer 50. The light emitting material 140 is disposed between the main body 110 and the cutting layer 120. The light emitting material 140, includes, but not limited to, a nano-coating layer. In some exemplary embodiments, the nano-coating layer may further includes gold (Au) or platinum (Pt) to accentuate the ultraviolet light emission efficiency of the nano-coating layer 140. The photocurable adhesive layer 50, for example, is disposed on a blue tape on a carrier 70 (for example, a steel frame (not shown)), and the work piece 60 is, for example, a to-be-diced wafer. In this exemplary embodiment, a material of the photocurable adhesive layer 50 includes, for example, an epoxy resin or other photocurable materials.

The main body 110 in the exemplary embodiment has a disk shape, for example, and the light emitting material 140 and the cutting layer 120 are disposed on the circumference of the disk-shaped main body 110. Further, the cutting layer 120 is formed with, for example, diamond grains. It should be appreciated that the disclosure is not limited a cutting layer formed with diamond grains. In other exemplary embodiments, the cutting layer 120 may be formed with other appropriate materials.

Figure 2A:
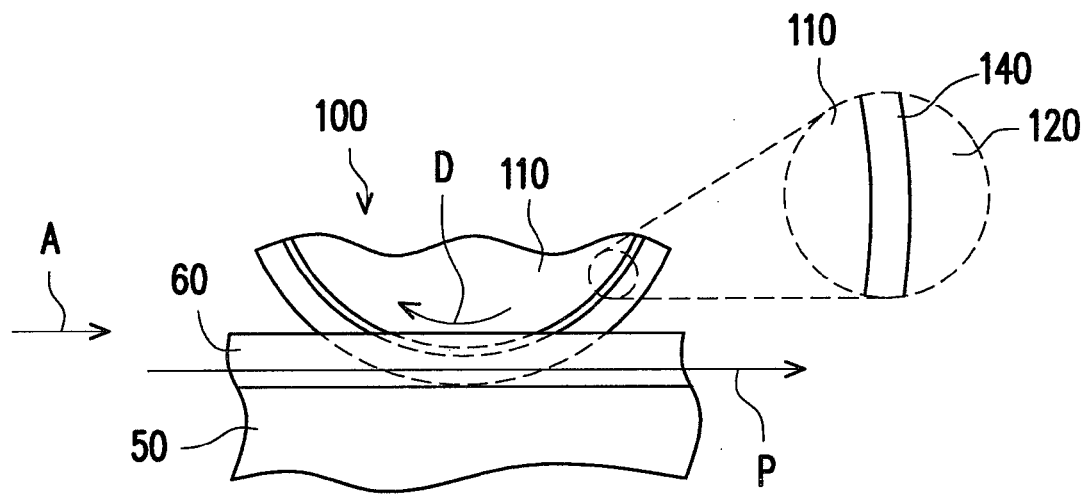
FIG. 2A is a schematic, sectional view of the cutting tool in FIG. 1.
Figure 2B:
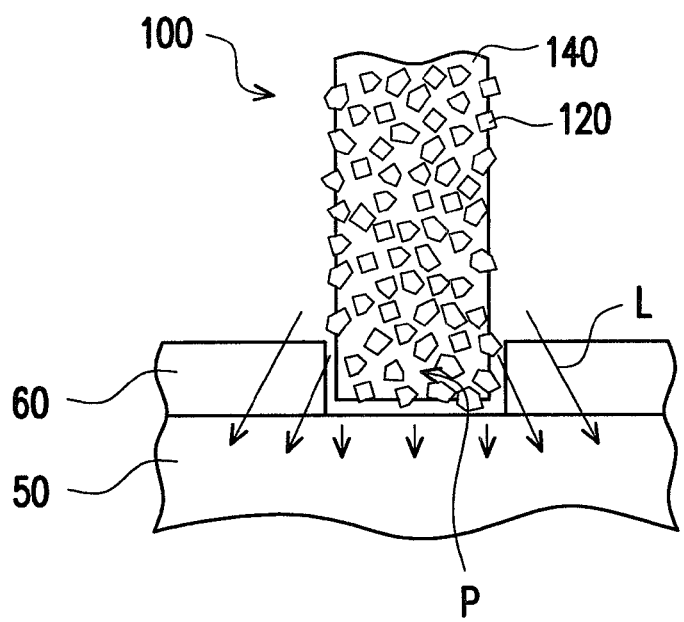
FIG. 2B is a sectional, side view of the cutting tool in FIG. 2A along the viewing angle A.

FIG. 2A is a sectional view of the cutting tool in FIG. 1. FIG. 2B is a sectional side view of the cutting tool in FIG. 2A along the viewing angle A. Referring to FIGS. 2A and 2B, the cutting tool 100 may spin at a high speed along the direction D to cut the workpiece 60 with the cutting layer 120. When the workpiece 60 is cut by the cutting tool 100 as shown in a mode shown in FIG. 2B, the cutting tool 100 approaches the photocurable adhesive layer 50 and the lights emitted by the light emitting material 140 may cure the photocurable adhesive layer 50 adjacent to the cutting path P. Hence, the chances of contaminating the cutting layer 120 of the cutting tool 100 by the adhesive substance of the photocurable layer 50 during the cutting process are reduced, and the cutting ability of the cutting tool 100 is maintained.

It is worthy to note that the degree of curing and the extent of the area that the photocurable adhesive layer 50 is being cured may rely on the intensity and the wavelength of the lights being released by the light emitting material 140 and the material properties of the photocurable adhesive layer 50. Hence, depending on the requirements, the pertinent photocurable adhesive layer 50 and light emitting material 140 may be selected such that an appropriate degree of curing and a suitable extent of the area of the photocurable adhesive layer 50 being cured may be achieved via the irradiation of the light emitted from the light emitting material 140.

More particularly speaking, the light emitting material 140 of the exemplary embodiment includes, for example, a nano-coating layer, such as a nano level zinc oxide (ZnO) coating layer, wherein the Fermi level thereof is between about 60 meV, and the energy bandgap thereof is between around 3.3 eV. Accordingly, the light emitting material 140 of the exemplary embodiment is applicable in emitting an UV light under room temperature for curing a UV curable adhesive layer, for example, the photocurable adhesive layer 50 of the exemplary embodiment of the invention.

Figure 3A:
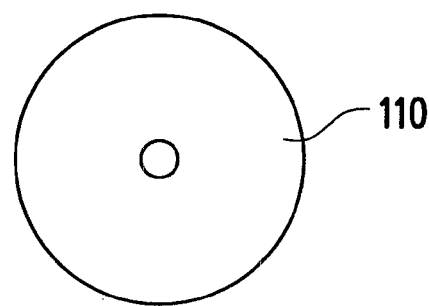
FIGS. 3A to 3C are schematic cross-sectional views illustrating a process of fabricating a cutting tool in FIG. 1.
Figure 3B:
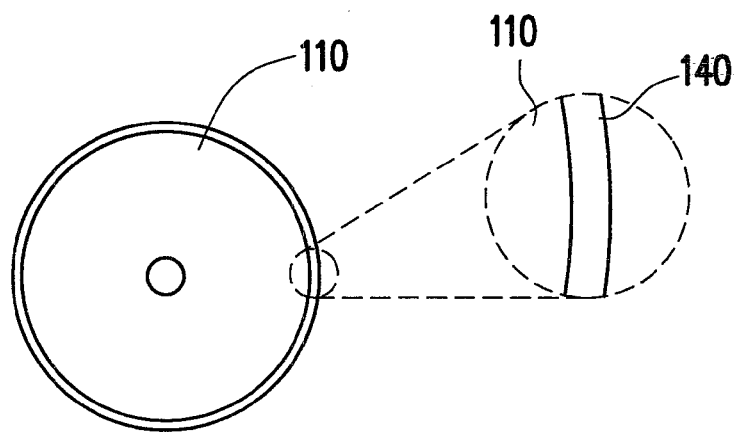
Figure 3C:
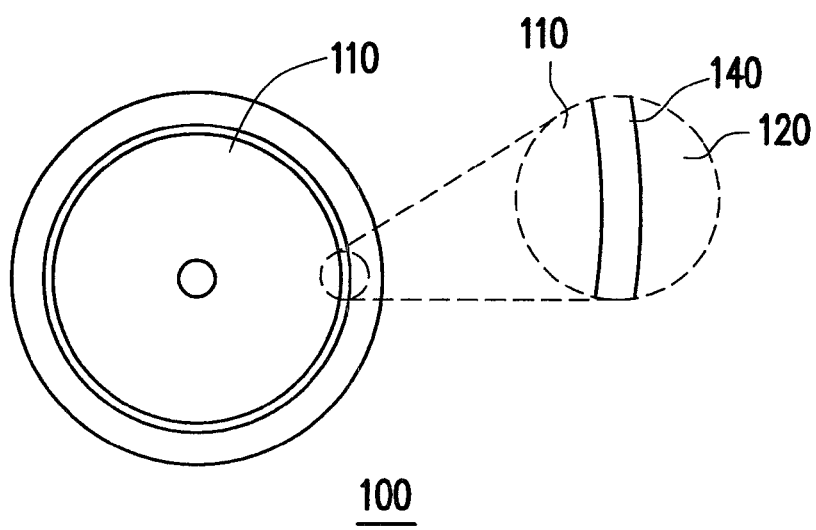

FIGS. 3A to 3C are schematic cross-sectional diagrams illustrating a process of fabricating a cutting tool in FIG. 1 according to an exemplary embodiment of the invention. Referring to FIG. 3A, a disk-shaped main body 110 is provided. The main body 110 is coated, via an electrochemical deposition process, for example, with a zinc oxide nano-coating layer 140 serving as the light emitting material 140. In some exemplary embodiments, gold or platinum particles may concurrently deposit on the surface of the main body 110 to form an Au—ZnO or Pt—ZnO nano-coating layer to enhance the light emission efficiency of the UV light. Thereafter, referring to FIG. 3C, a cutting layer 120 is disposed on the surface of the main body 110, wherein the light emitting material 140 is positioned between the main body 110 and the cutting layer 120. The doctoral thesis, "Characterizations of Electrochemically Synthesized Zinc Oxide", by Hwai-Fu Tu is incorporated herein by reference.

Figure 4A:
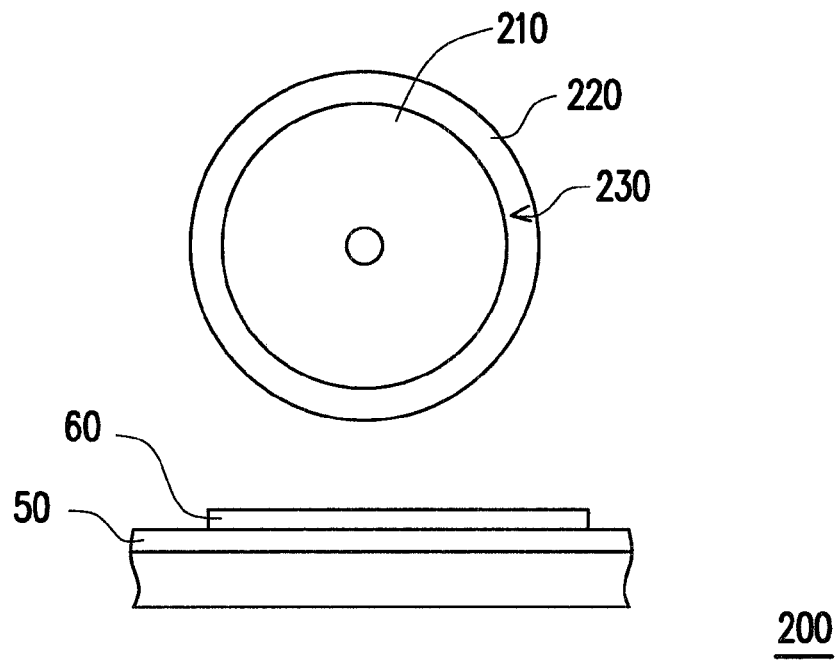
FIG. 4A is a schematic diagram of the cutting tool of another exemplary embodiment of the invention.
Figure 4B:
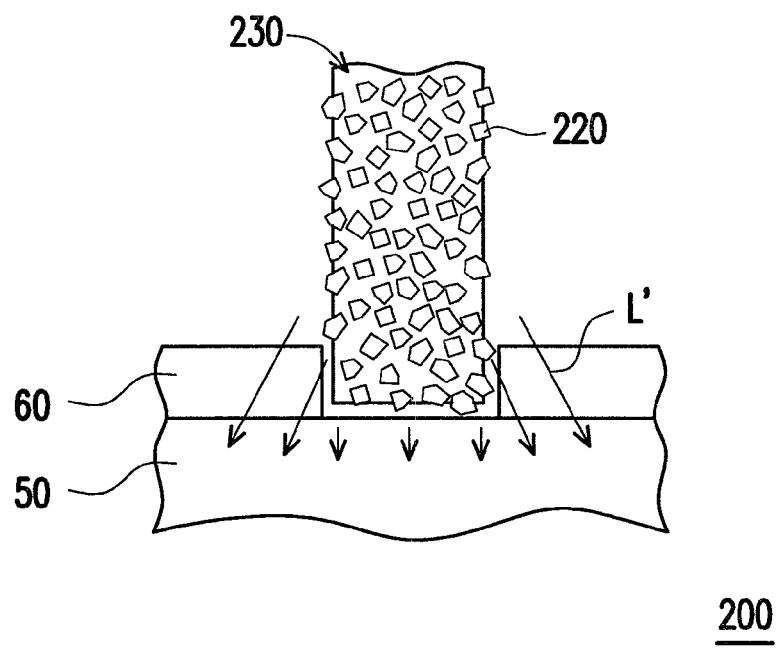
FIG. 4B is a schematic diagram illustrating the cutting of a work piece with the cutting tool of FIG. 4A.

FIG. 4A is a schematic diagram of the cutting tool of another exemplary embodiment of the invention. FIG. 4B is a schematic diagram illustrating the cutting of a work piece with the cutting tool of FIG. 4A. Referring to FIGS. 4A and 4B, comparing to the cutting tool in FIG. 1, in which the light emitting material 140 is disposed between the main body 110 and the cutting layer 120, and the light emitting material 230 of the cutting tool 200 in this exemplary embodiment is dispersed in the cutting layer 220. When the cutting layer 220 disposed on the surface of the main body 210 is performing a cutting process on the workpiece 60, the light emitting material 230 may emits a light L' to cure the photocurable adhesive layer 50 adjacent to the cutting path. Hence, the probability of contaminating the cutting layer 220 with the adhesive substance of the photocurable adhesive layer 50 is reduced to maintain the cutting ability of the cutting tool 200.

Figure 5A:
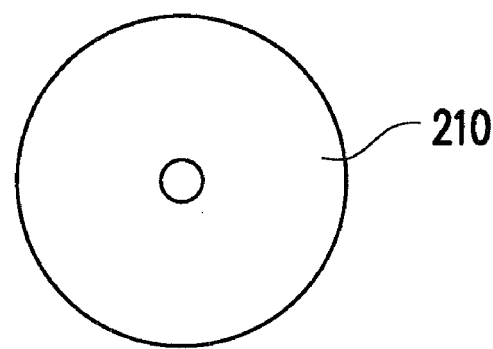
FIGS. 5A to 5B are, schematic cross-sectional diagrams illustrating a process of fabricating a cutting tool in FIG. 4 according to an exemplary embodiment of the invention.
Figure 5B:
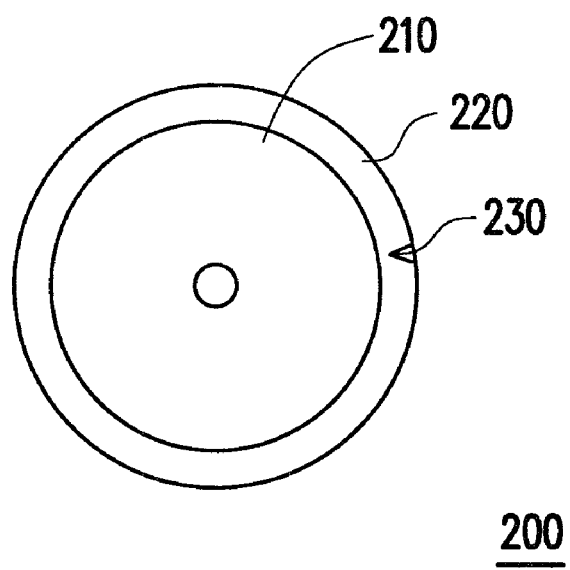

FIGS. 5A to 5B are schematic cross-sectional diagrams illustrating a process of fabricating a cutting tool in FIG. 4 according to an exemplary embodiment of the invention. Referring to FIG. 5A, a disk-shaped main body 210 is provided. When a cutting layer 220 is formed on the circumference of the disk-shaped main body 210, the light emitting material 230 is concurrently dispersed in the cutting layer 220. The method of dispersing the light emitting material 230 into the cutting layer 220 includes, for example, coating the light emitting material 230 (zinc oxide nano-coating layer) between the cutting particles via an electrochemical deposition process during the coating of the cutting particles, used in forming the cutting layer 220, on the surface of the main body 210. The cutting particles include, for example, diamond particles.

Accordingly, the cutting tool of the disclosure is configured with a light emitting material. Hence, when the cutting layer of the cutting tool performs the cutting process on the workpiece disposed on the photocurable adhesive layer, the lights L emitted from the light emitting material would cure the photocurable adhesive layer adjacent to the cutting path P. As a result, the chance of contaminating the cutting tool by the adhesive substance of the photocurable adhesive layer during the cutting process is reduced, and the cutting ability of the cutting tool is maintained. Moreover, having gold or platinum dispersed in the nano-coating layer of the light emitting material may enhance the efficiency of light emission of the light emitting layer It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A cutting tool, suitable for cutting a workpiece disposed on a photocurable adhesive layer, the cutting tool comprising:
   a main body;
   a cutting layer, disposed on a surface of the main body and used for cutting the workpiece; and
   a light emitting material, disposed inside the cutting layer or between the cutting layer and the main body, and used for releasing a light when the cutting layer cutting the workpiece along a cutting path, wherein the light cures the photocurable adhesive layer adjacent to the cutting path.

2. The cutting tool of claim 1, wherein the light emitting material emits an ultraviolet light.

3. The cutting tool of claim 1, wherein the light emitting material comprises zinc oxide nano-coating layer.

4. The cutting tool of claim 1, wherein the light emitting material further comprises gold or platinum.

5. The cutting tool of claim 3, wherein the light emitting is disposed between the main body and the cutting layer.

6. The cutting tool of claim 1, wherein the cutting layer comprises diamond particles.

7. The cutting tool of claim 1, wherein the main body has a disk shape and the light emitting material and the cutting layer are disposed on a circumference of the disk-shaped main body.

8. The cutting tool of claim 7, wherein the light emitting material is dispersed in the cutting layer.

* * * * *